United States Patent
Tarafdar et al.

(10) Patent No.: US 10,229,826 B2
(45) Date of Patent: Mar. 12, 2019

(54) SYSTEMS AND METHODS FOR FORMING LOW RESISTIVITY METAL CONTACTS AND INTERCONNECTS BY REDUCING AND REMOVING METALLIC OXIDE

(71) Applicant: Lam Research Corporation, Fremont, CA (US)

(72) Inventors: Raihan Tarafdar, Santa Clara, CA (US); Shruti Thombare, Sunnyvale, CA (US); Jeong-Seok Na, Fremont, CA (US); Raashina Humayun, Los Altos, CA (US); Chiukin Steven Lai, Sunnyvale, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/729,081

(22) Filed: Oct. 10, 2017

(65) Prior Publication Data

US 2018/0114694 A1    Apr. 26, 2018

Related U.S. Application Data (60) Provisional application No. 62/411,078, filed on Oct. 21, 2016.

(51) Int. Cl.
  *H01L 21/02* (2006.01)
  *H01L 21/67* (2006.01)
  *H01L 21/768* (2006.01)

(52) U.S. Cl.
  CPC .. *H01L 21/02068* (2013.01); *H01L 21/67028* (2013.01); *H01L 21/76861* (2013.01)

(58) Field of Classification Search
  CPC combination set(s) only.
  See application file for complete search history.

(56) References Cited

U.S. PATENT DOCUMENTS

| | | | |
|---|---|---|---|
| 8,709,948 B2 | 4/2014 | Danek et al. | |
| 2008/0135834 A1* | 6/2008 | Kaza | G11C 13/0014 257/40 |
| 2010/0075494 A1* | 3/2010 | Chung | C23C 16/34 438/643 |

OTHER PUBLICATIONS

Hesemann, H., Müllner, P., Kraft, O., & Arzt, E. (1999). The Effect of Film Thickness on Stress and Transformation Behavior in Cobalt Thin Films. MRS Proceedings, 594, 219. doi:10.1557/PROC-594-219.

(Continued)

*Primary Examiner* — Mamadou Diallo (57) ABSTRACT

A method for depositing a metal layer on a barrier layer includes a) arranging a substrate in a processing chamber. The substrate has been exposed to at least one of air and/or oxidizing chemistry and includes a barrier layer and one or more underlying layers, wherein the barrier layer includes a material selected from a group consisting of tantalum nitride, titanium nitride, tantalum and titanium. The method includes b) supplying a gas selected from a group consisting of hydrazine, a gas including fluorine species, a gas including chlorine species, derivatives of hydrazine, ammonia, carbon monoxide, a gas including amidinates, and/or a gas including metal organic ligands to the processing chamber for a predetermined period to remove oxidation from the barrier layer. The method includes c) depositing a metal layer on the barrier layer after b). The metal layer includes a metal selected from a group consisting of cobalt, copper, tungsten, ruthenium, rhodium, molybdenum, and nickel.

19 Claims, 5 Drawing Sheets

(56) References Cited

OTHER PUBLICATIONS

Avasarala, Bharat & Haldar, Pradeep. (2010). Electrochemical oxidation behavior of titanium nitride based electrocatalyst under PEM fuel cell conditions. Electrochimica Acta. 55. 9024-9034. 10.1016/j.electacta.2010.08.035.

* cited by examiner

SYSTEMS AND METHODS FOR FORMING LOW RESISTIVITY METAL CONTACTS AND INTERCONNECTS BY REDUCING AND REMOVING METALLIC OXIDE

CROSS-REFERENCE TO RELATED APPLICATIONS

This application claims the benefit of U.S. Provisional Application No. 62/411,078, filed on Oct. 21, 2016. The entire disclosure of the application referenced above is incorporated herein by reference.

FIELD

The present disclosure relates to substrate processing, and more particularly to systems and methods for reducing and removing oxidation from a barrier layer.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit, etch or treat film on a substrate such as a semiconductor wafer. The substrate processing systems typically include a processing chamber, a gas distribution device and a substrate support. During processing, the substrate is arranged on the substrate support. Different gas mixtures may be introduced into the processing chamber to treat the film. Substrate heating and/or radio frequency (RF) plasma may also be used to activate chemical reactions.

The substrate may be processed by two or more semiconductor tools and may be exposed to air between processing steps. Alternatively, the substrate may be exposed to oxidizing gases such as molecular oxygen ($O_2$) or water ($H_2O$) during processing in single tool.

Cobalt (Co) will likely be used for processes with less than 10 nm feature sizes. For example, Co may be used for logic interconnects (e.g. middle-of-the-line (MOL) or back-end-of-line (BEOL)), metal gates, and/or source/drain contacts. There are a number of process issues with using Co as a metal layer in these applications. Other than Co, other metals such as tungsten (W), nickel (Ni), rhodium (Rh), and ruthenium (Ru) also can be used for metal gates and/or source/drain contacts. Copper (Cu), W, Ni, Rh, and Ru can be used for logic interconnects (e.g. middle-of-the-line (MOL) or back-end-of-line (BEOL)).

A barrier layer is deposited between the metal layer and underlying layers to prevent diffusion. The barrier layer includes titanium/titanium nitride (Ti/TiN), tantalum nitride/tantalum (TaN/Ta), TiN or TaN may be oxidized after exposure to air or oxidizing chemistry. Co or other metals may not adhere well to oxidized barrier layers. As a result, the surface of the barrier layer needs to be cleaned before the metallization step to reduce defects and other integration issues related to adhesion.

For resistivity reduction and grain growth, the Co and metal layer is typically annealed to about 400° C. post deposition. Co undergoes phase transformation during annealing, which leads to the development of a large stress hysteresis within the film. The stress hysteresis can cause film delamination if adhesion of the Co film is inadequate. Other metals also experience stress hysteresis and some phase transformation which could lead to adhesion issue as well.

SUMMARY

A method for depositing a metal layer on a barrier layer includes a) arranging a substrate in a processing chamber. The substrate has been exposed to at least one of air and/or oxidizing chemistry and includes a barrier layer and one or more underlying layers, wherein the barrier layer includes a material selected from a group consisting of tantalum nitride, titanium nitride, tantalum and titanium. The method includes b) supplying a gas selected from a group consisting of hydrazine, a gas including fluorine species, a gas including chlorine species, derivatives of hydrazine, ammonia, carbon monoxide, a gas including amidinates, and/or a gas including metal organic ligands to the processing chamber for a predetermined period to remove oxidation from the barrier layer. The method includes c) depositing a metal layer on the barrier layer after b). The metal layer includes a metal selected from a group consisting of cobalt, copper, tungsten, ruthenium, rhodium, molybdenum, and nickel.

In other features, the method includes controlling a temperature of the substrate to a predetermine temperature in a range from 100° C. to 450° C. during b). b) further comprises supplying a carrier gas selected from a group consisting of argon and helium. The predetermined period is in a range from 2 seconds to 2 minutes. The method includes controlling a pressure in the processing chamber to a predetermined pressure in a range from 1 mT to 30 T during b). The method includes, after b) and before c), depositing a barrier layer/adhesion layer. The barrier layer/adhesion layer includes a material selected from a group consisting of tungsten, tungsten carbonitride, tungsten carbide.

In other features, the method includes exposing the substrate to plasma at least one of before b) and/or after b). The plasma is generated using a plasma gas selected from a group consisting of molecular hydrogen, molecular nitrogen and nitrogen trifluoride.

In other features, the method includes controlling a temperature of the substrate to a predetermined temperature in a range from 100° C. to 450° C. while the plasma is generated. The method includes controlling a pressure in the processing chamber to a predetermined pressure in a range between 10 mT and 10 T while the plasma is generated.

In other features, the method includes supplying RF power in a range from 500 W to 2.5 kW to generate the plasma.

In other features, c) is performed using at least one of atomic layer deposition, chemical vapor deposition pulsed nucleation layer and pulsed deposition layer. c) is performed by depositing a metal seed layer using a first deposition method and depositing the metal layer using a second deposition method. The second deposition method is selected from a group consisting of electrochemical plating, electroless deposition, or chemical vapor deposition.

In other features, the method includes annealing the substrate. The gas including chlorine species is selected from a group consisting of tungsten (V) chloride, tungsten hexachloride, molybdenum tetrachloride, and molybdenum (V) chloride. The gas including fluorine species is selected from a group consisting of tungsten hexafluoride and molybdenum hexafluoride.

A method for depositing a metal layer on a barrier layer includes a) arranging a substrate in a processing chamber.

The substrate has been exposed to at least one of air and/or oxidizing chemistry and includes a metal contact layer and one or more underlying layers defining portions of a transistor. The metal contact layer includes a metal selected from a group consisting of cobalt, tungsten, ruthenium, rhodium, molybdenum, and nickel. The method includes b) supplying a gas selected from a group consisting of hydrazine, a gas including fluorine species, a gas including chlorine species, derivatives of hydrazine, ammonia, carbon monoxide, a gas including amidinates, and/or a gas including metal organic ligands to the processing chamber for a predetermined period to remove oxidation of the metal contact layer. The method includes c) depositing a barrier layer on the metal contact layer after b). The barrier layer includes a material selected from a group consisting of tantalum nitride, titanium nitride, tantalum, titanium and tungsten carbonitride.

In other features, the method includes controlling a temperature of the substrate to a predetermine temperature in a range from 100° C. to 450° C. during b). b) further comprises supplying a carrier gas selected from a group consisting of argon and helium. The predetermined period is in a range from 2 seconds to 2 minutes.

In other features, the method includes controlling a pressure in the processing chamber to a predetermined pressure in a range from 1 mT to 30 T during b). The method includes exposing the substrate to plasma at least one of before b) and/or after b). The plasma is generated using a plasma gas selected from a group consisting of molecular hydrogen, molecular nitrogen and nitrogen trifluoride. The method includes controlling a temperature of the substrate to a predetermined temperature in a range from 100° C. to 450° C. while the plasma is generated.

In other features, the method includes controlling a pressure in the processing chamber to a predetermined pressure in a range between 10 mT and 10 T while the plasma is generated. The method includes supplying RF power in a range from 500 W to 2.5 kW to generate the plasma.

In other features, the gas including chlorine species is selected from a group consisting of tungsten (V) chloride, tungsten hexachloride, molybdenum tetrachloride, and molybdenum (V) chloride. The gas including fluorine species is selected from a group consisting of tungsten hexafluoride and molybdenum hexafluoride.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
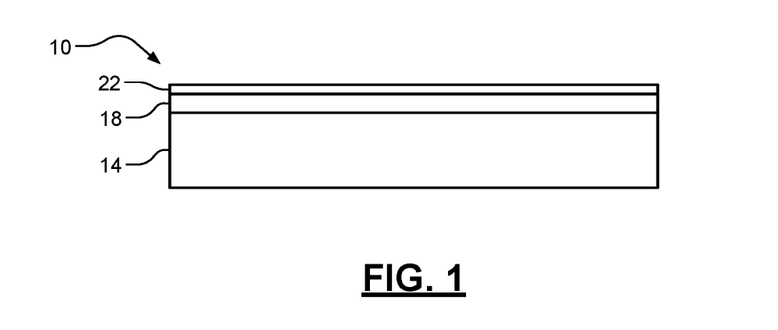
FIG. 1 is a side cross-sectional view of an example of a substrate including a barrier layer and a metal layer such as cobalt.

Referring now to FIG. 1, a substrate 10 includes one or more underlying layers 14. In some processes, a barrier layer 18 is deposited on the one or more underlying layers 14 prior to deposition of a metal layer 22. In some examples, the barrier layer 18 includes a Ti/TiN barrier layer and the metal layer 22 includes cobalt (Co). While the foregoing description describes Ti/TiN as an example of the barrier layer, a tantalum/tantalum nitride (Ta/TaN), TiN or TaN barrier layer may also be used. While the foregoing description describes cobalt as an example of the metal layer, tungsten (W), ruthenium (Ru), rhodium (Rh), molybdenum (Mo), copper (Cu), and nickel (Ni) may be used as the metal layer 22 in some applications.

If the barrier layer 18 is exposed to air or oxidizing chemistry before deposition of the metal layer 22, oxidation of the barrier layer 18 may occur and the Ti/TiN in the barrier layer is partially converted to TiO/TiON. The TiO/TiON decreases adhesion of the metal layer 22, which may cause defects (particularly if the metal layer is subsequently annealed). In some examples, the Ti and/or TiN can be deposited using physical vapor deposition (PVD). In other examples, the TiN can be deposited using metal-organic chemical vapor deposition (MOCVD). In other examples, the TiN can be deposited using atomic layer deposition (ALD) (for example using titanium tetrachloride ($TiCl_4$) gas precursor).

Systems and methods according to the present disclosure expose a substrate including the barrier layer 18 to a thermal chemical treatment after exposure to air or oxidizing chemistry to remove oxidation from the barrier layer 18. For example, the thermal chemical treatment reduces TiO/TiON to Ti/TiN.

In some examples, the thermal chemical treatment includes exposing the substrate to a gas including fluorine (F) species (such as tungsten hexafluoride ($WF_6$) or molybdenum hexafluoride ($MoF_6$)), a gas including chlorine (Cl) species (such as tungsten (V) chloride ($WCl_6$), tungsten hexachloride ($WCl_6$), molybdenum tetrachloride ($MoCl_4$), molybdenum V chloride ($MoCl_5$)), hydrazine ($N_2H_4$) gas, derivatives of $N_2H_4$ gas, $NH_3$ gas, carbon monoxide (CO), amidinates, and/or metal organic ligands to remove oxidation of the barrier layer. An inert carrier gas such as argon (Ar), helium (He), etc. can optionally be used.

In some examples, the thermal chemical treatment is performed for a predetermined period. In some examples, the thermal chemical treatment is performed for a predetermined period in a range from 2 seconds to 4 minutes. In some examples, the thermal chemical treatment is performed for a predetermined period in a range from 2 seconds to 2 minutes. In some examples, the thermal chemical treatment is performed at an elevated temperature within a predetermined temperature range. In some examples, the thermal chemical treatment is performed within a predetermined temperature range from 100° C. to 450° C. In some examples, the thermal chemical treatment is performed at a chamber pressure within a predetermined pressure range. In some examples, the predetermined pressure during the thermal chemical treatment is in a range from 1 mT to 30 Torr.

In some examples, the substrate is further exposed to remote or direct plasma before or after the thermal chemical treatment to further reduce the TiO/TiON, TaO/TaON, TiON or TaON and remove the residue left behind after the thermal chemical treatment. In some examples, the remote or direct plasma includes a plasma gas mixture including molecular hydrogen ($H_2$), molecular nitrogen ($N_2$) and/or nitrogen trifluoride ($NF_3$).

In some examples, the plasma treatment is performed before and/or after the thermal chemical treatment. In some examples, the plasma treatment is performed within a predetermined temperature range from 100° C. to 450° C. In some examples, the plasma treatment is performed for a predetermined period in a range from 10 seconds to 4 minutes. In some examples, the predetermined pressure during plasma treatment is in a range from 10 mT to 10 Torr. In some examples, plasma power is provided in a range from 500 W to 2.5 kW, although other plasma power levels can be used.

The thermal chemical treatment may reduce the thickness of the TiN/TaN film from few Angstroms to 1 nm and the thermal chemical treatment is self-limiting.

Figure 2:
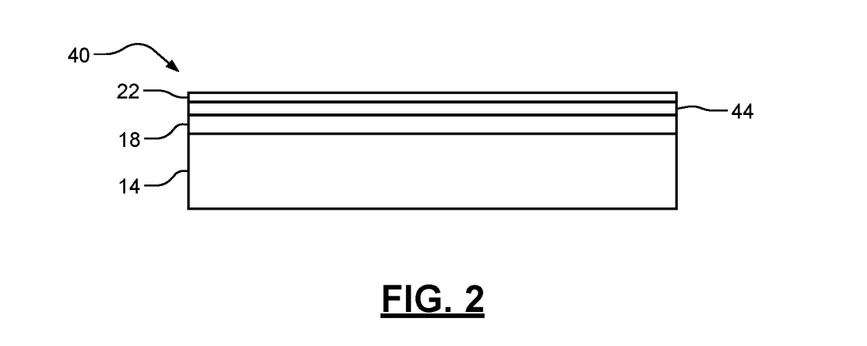
FIG. 2 is a side cross-sectional view of another example of a substrate including a barrier layer, a barrier layer/adhesion layer and a metal layer such as cobalt.

Referring now to FIG. 2, a substrate 40 includes one or more underlying layers 14. In some processes, the barrier layer 18 is deposited on the one or more underlying layers 14. The barrier layer 18 is treated as described above using thermal chemical treatment and/or thermal chemical treatment and plasma to reduce oxidation.

In some examples, a barrier layer/adhesion layer 44 is deposited prior to deposition of the metal layer 22. In some examples, the barrier layer/adhesion layer 44 includes a metallic layer. In some examples, the barrier layer/adhesion layer 44 includes tungsten, tungsten carbide, or tungsten carbonitride (WCN), although other barrier layer/adhesion layers can be used. The barrier layer/adhesion layer 44 provides a barrier layer and further increases the adhesion strength of the metal layer 22.

In some examples, the barrier layer/adhesion layer 44 is deposited using atomic layer deposition (ALD) or chemical vapor deposition (CVD), although other methods can be used. The barrier layer/adhesion layer 44 can also act as a diffusion barrier. In some examples, the barrier layer/adhesion layer 44 is deposited in the same processing tool where both the thermal chemical treatment and the plasma treatment are performed.

The metal layer 22 can include Co, W, Mo, Ni, Ru, Rh, and Cu, which can be deposited using ALD or CVD. In other examples, the metal layer is deposited using pulsed nucleation layer (PNL) or pulsed deposition layer (PDL) processes using metalorganic precursors. In other examples, the metal layer is deposited using physical vapor deposition (PVD) methods. In some examples, a cobalt seed layer or other metallic seed layer is initially deposited. After the Co and other metallic seed layer is deposited, another deposition method such as electrochemical plating (ECP), electroless deposition (ELD), or chemical vapor deposition (CVD) methods can be used to fill features and for overburden.

Figure 3:
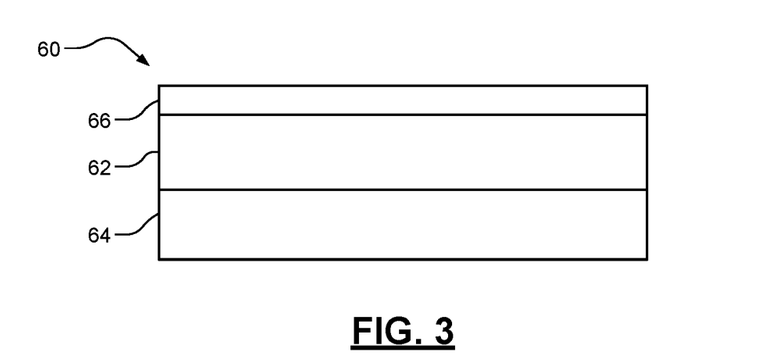
FIG. 3 is a side cross-sectional view of another example of a substrate including a metal contact layer such as cobalt and a barrier layer.

Referring now to FIG. 3, a substrate 60 includes a metal contact 62 arranged on one or more underlying layers 64. A barrier layer 66 is deposited on the metal contact. In some examples, for technology node of N7 and below, Co is used as source drain contact (or metal contact) for transistors. When exposed to ambient, the metal contact 62 oxidizes. The oxidation of the metal contact 62 (e.g. cobalt oxide ($CoO_x$)) is removed before depositing the barrier layer 66. In some examples, the barrier layer includes Ti, TiN, Ta/TaN and/or WCN. The thermal chemical treatment and/or plasma treatment process described above and below may be used to remove the $CoO_x$ before depositing the barrier layer 66 and subsequent metal layers (not shown). In addition to Co, the contact metal contact can be tungsten (W), ruthenium (Ru), molybdenum (Mo), and nickel (Ni) as well.

Figure 4:
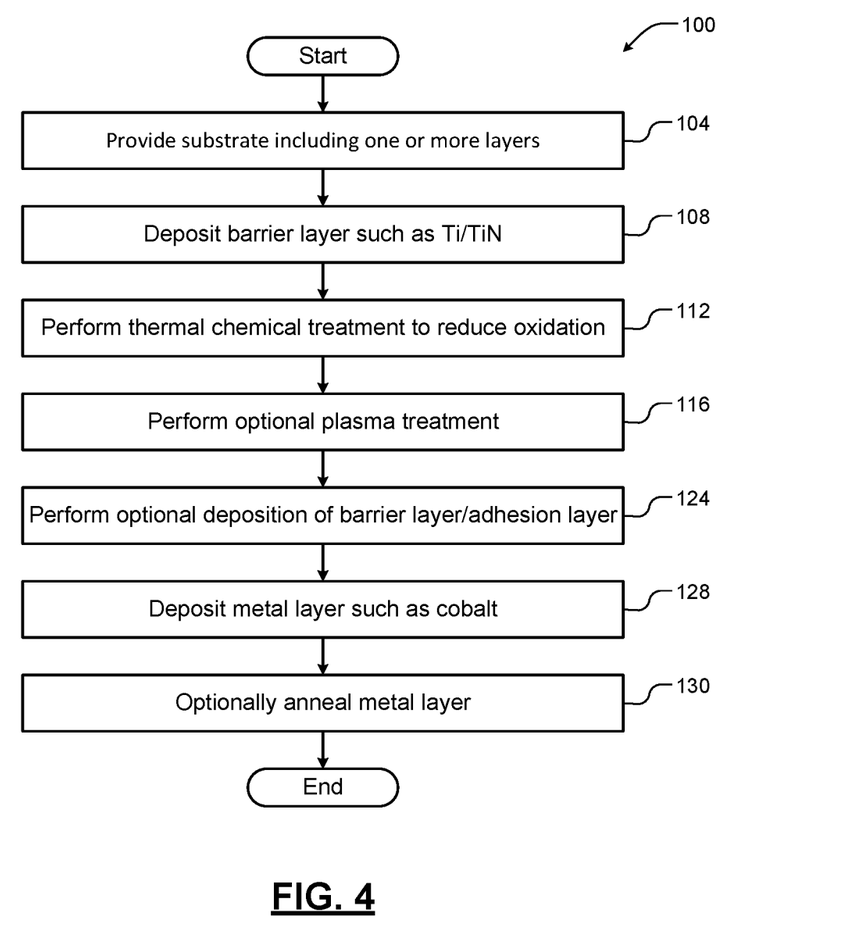
FIG. 4 is a flowchart illustrating an example of a method for reducing oxidation of the barrier layer prior to depositing a metal layer on a substrate according to the present disclosure.

Referring now to FIG. 4, a method 100 for performing thermal chemical treatment to reduce oxidation of the barrier layer in FIGS. 1-2 and/or the metal contact layer in FIG. 3 is shown. A substrate including one or more layers is provided at 104. At 108, a barrier layer is deposited on the one or more layers. In some examples, the barrier layer includes Ti/TiN, Ta/TaN, TiN, or TaN. If the barrier layer is oxidized through exposure to air, oxidizing chemistry, or for other reasons, thermal chemical treatment is performed at 112. At 116, an optional plasma treatment is performed. At 124, an optional barrier layer/adhesion layer is deposited on the barrier layer. At 128, a metal layer such as Co, W, Mo, Cu, Rh, Ru or Ni is deposited. At 130, an optional annealing step may be performed.

In some examples, the annealing step is performed at a temperature greater than 350° C. In some examples, the annealing step is performed at a temperature greater than 400° C.

Figure 5:
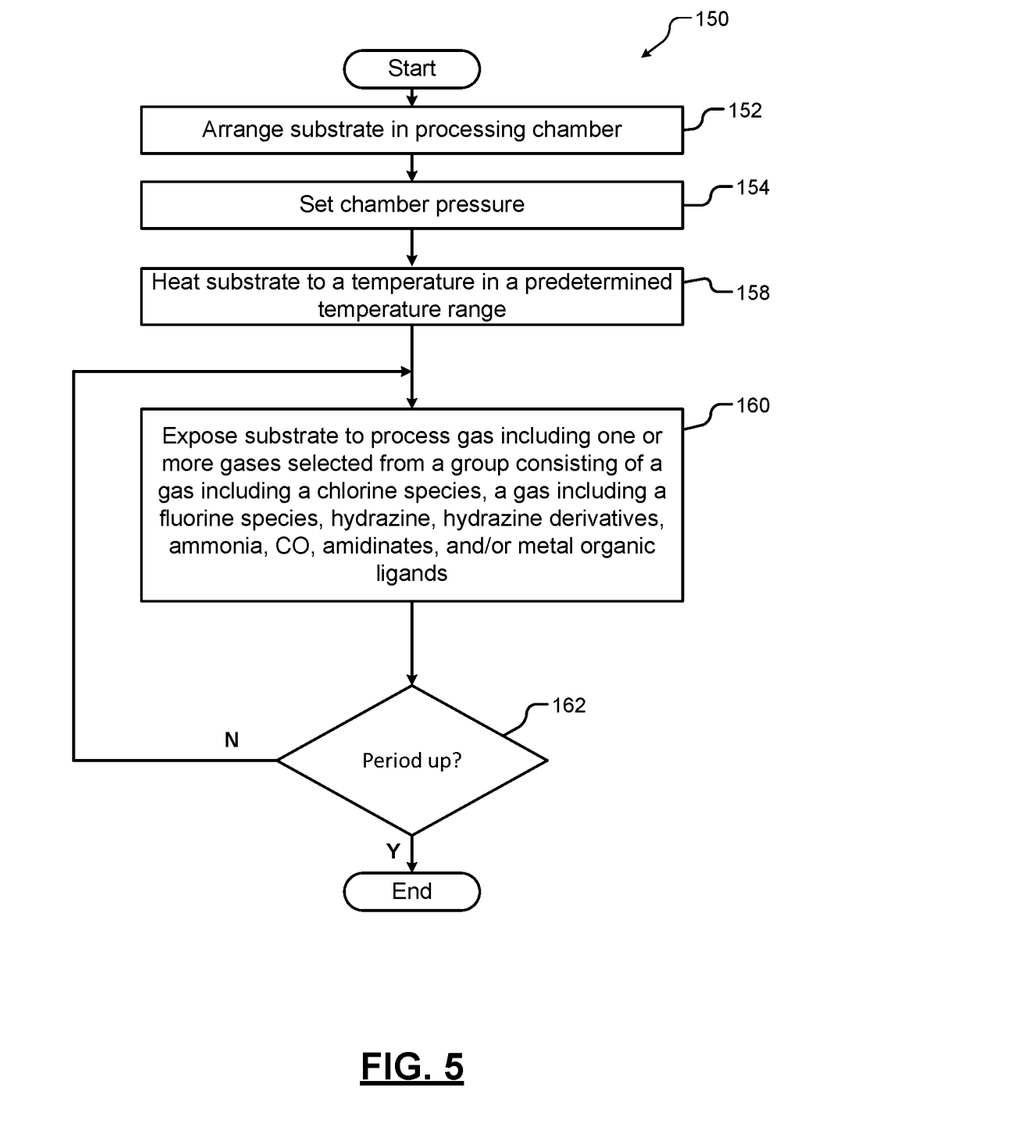
FIG. 5 is a flowchart illustrating an example of a method for performing thermal chemical treatment to reduce oxidation of the barrier layer according to the present disclosure.

Referring now to FIG. 5, a method 150 for performing a thermal chemical treatment to reduce oxidation of the barrier layer in FIGS. 1-2 and/or the metal contact layer in FIG. 3 is shown. At 152, a substrate is arranged in a processing chamber. At 154, the chamber pressure is set. At 158, the substrate is heated to a temperature in a predetermined temperature range. At 160, the substrate is exposed to a process gas including one or more gases selected from a group consisting of a gas including chlorine (Cl) species (such as $WCl_5$, $WCl_6$, $MoCl_4$, $MoCl_5$), a gas including fluorine (F) species (such as $WF_6$ or $MoF_6$), hydrazine, hydrazine derivatives, ammonia, carbon monoxide (CO), amidinates, and/or metal organic ligands. At 162, the method determines whether the exposure period is over. If 162 is false, the method returns to 160. Otherwise the method ends.

Figure 6:
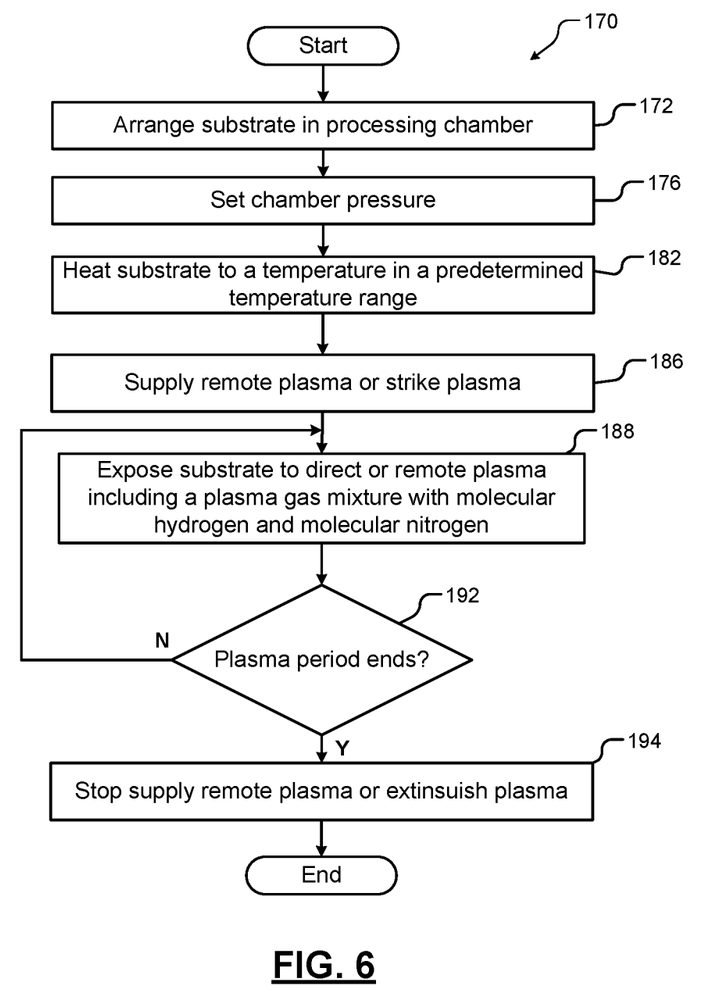
FIG. 6 is a flowchart illustrating an example of a method for performing plasma treatment of the substrate to reduce oxidation of the barrier layer according to the present disclosure.

Referring now to FIG. 6, a method 170 for performing plasma treatment of the substrate is shown. While the plasma treatment is performed after the thermal chemical treatment in FIG. 5, the plasma treatment can be performed before the thermal chemical treatment. At 172, the substrate is arranged in a processing chamber. At 176, the chamber pressure is set to a predetermined pressure. Process gas such as an inert carrier gas and/or plasma process gas is next optionally supplied to the chamber (when plasma is supplied directly in the processing chamber). At 182, the substrate is heated to a predetermined temperature range. At 186, remote plasma is supplied to the processing chamber or plasma is struck in the processing chamber. At 188, the substrate is exposed to direct or remote plasma. In some examples, the plasma gas mixture includes $H_2$ and/or $N_2$, although other plasma process gases may be used. At 192, the method determines whether the plasma exposure period is over. If 194 is true, the remote plasma supply is stopped or the plasma is extinguished. If 192 is false, the method returns to 188. Otherwise the method ends.

In some examples, the barrier layer/adhesion layer includes tungsten (W), tungsten nitride (WN), tungsten carbide (WC), or tungsten carbonitride (WCN) that can be deposited using one or more methods including at least one of atomic layer deposition (ALD), chemical vapor deposition (CVD), plasma vapor deposition (PVD), pulsed nucleation layer (PNL), pulsed deposition layer (PDL), plasma-enhanced ALD or CVD methods. For example, suitable methods for depositing the barrier layer/adhesion layer are described in commonly assigned U.S. Pat. No. 8,709,948, "Tungsten Barrier and Seed for Copper Filled Through Silicon Vias", which is hereby incorporated by reference in its entirety.

Figure 7:
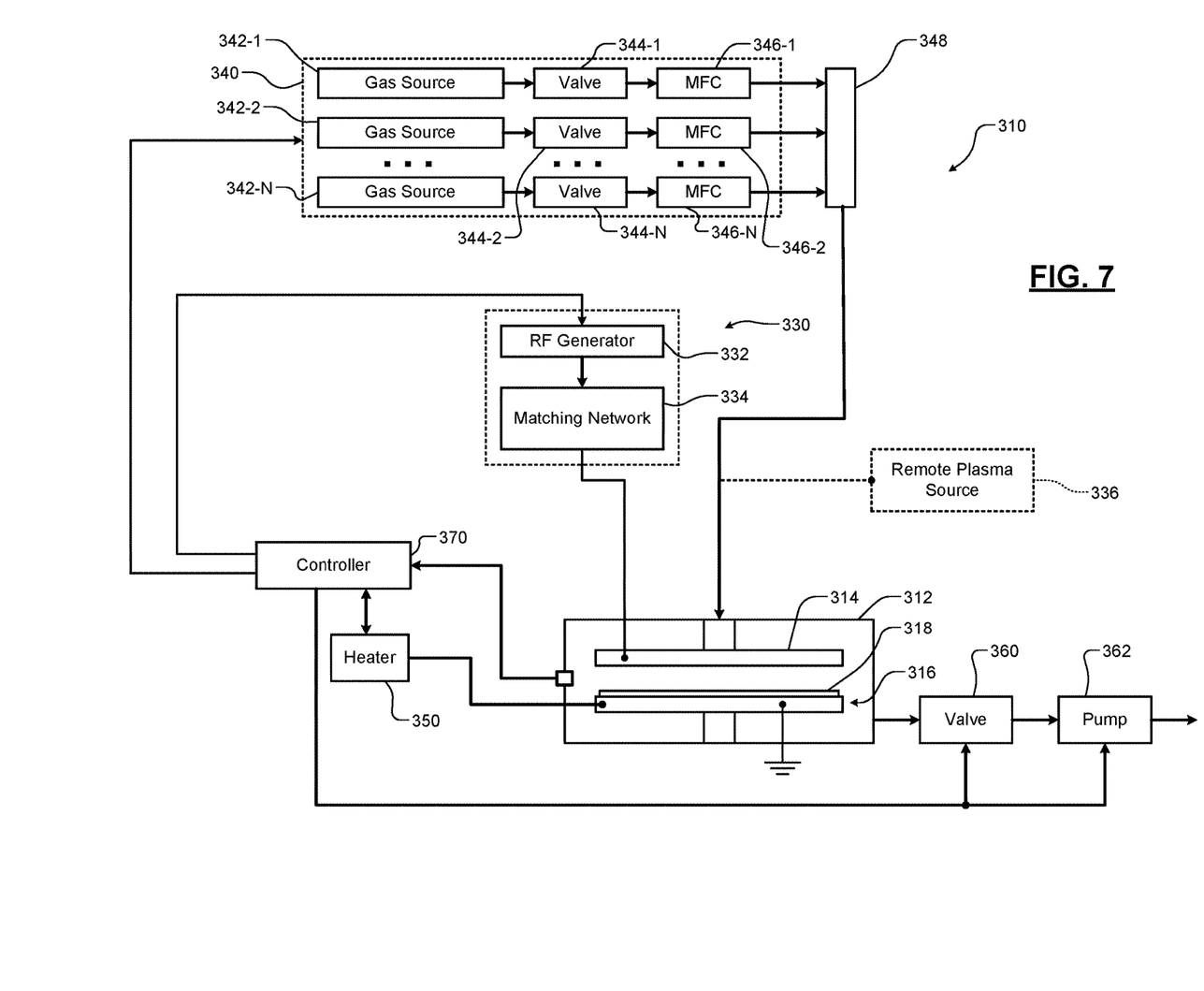
FIG. 7 is a functional block diagram of an example of a chamber for performing the methods of FIGS. 4-6.

Referring now to FIG. 7, an example of a substrate processing system for performing some of the substrate treatments described herein is shown. While specific examples of substrate processing systems are shown, other substrate processing systems can be used.

A substrate processing system 310 in FIG. 7 includes a processing chamber 312 that encloses other components of the substrate processing system 310 and contains the RF plasma (if used for a particular substrate treatment). The substrate processing system 310 includes a showerhead 314 and a substrate support assembly 316. A substrate 318 is arranged on the substrate support assembly 316. The showerhead 314 introduces and distributes process gases.

If plasma is used, the plasma can be direct or remote plasma. In this example, an RF generating system 330 generates and outputs an RE voltage to either the showerhead 314 or the substrate support assembly 316 (the other is DC grounded, AC grounded or floating). For example only, the RF generating system 330 may include an RF voltage generator 332 that generates the RF voltage that is fed by a matching network 334 to the showerhead 314 or the substrate support assembly 316. Alternately, the plasma may be delivered by a remote plasma source 336.

A gas delivery system 340 includes one or more gas sources 342-1, 342-2, . . . , and 342-N (collectively gas sources 342), where N is an integer greater than zero. The gas sources 342 supply one or more etch gas mixtures, precursor gas mixtures, cleaning gas mixtures, ashing gas mixtures, etc. to the processing chamber 312. Vaporized precursor may also be used. The gas sources 342 are connected by valves 344-1, 344-2, . . . , and 344-N (collectively valves 344) and mass flow controllers 346-1, 346-2, . . . , and 346-N (collectively mass flow controllers 346) to a manifold 348. An output of the manifold 348 is fed to the processing chamber 312. For example only, the output of the manifold 348 is fed to the showerhead 314.

A heater 350 may be connected to a heater coil (not shown) arranged in the substrate support assembly 316. The heater 350 may be used to control a temperature of the substrate support assembly 316 and the substrate 318. A valve 360 and pump 362 may be used to evacuate reactants from the processing chamber 312. A controller 370 may be used to control components of the substrate processing system 310. For example only, the controller 370 may be used to control flow of process gases, monitoring of process parameters such as temperature, pressure, power, etc, striking and extinguishing plasma, removal of reactants, etc.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing a metal layer on a barrier layer, comprising:
   a) arranging a substrate in a processing chamber, wherein the substrate has been exposed to at least one of air and/or oxidizing chemistry and includes a barrier layer and one or more underlying layers,
      wherein the barrier layer includes a material selected from a group consisting of tantalum nitride, titanium nitride, tantalum and titanium;
   b) supplying a gas selected from a group consisting of hydrazine, a gas including fluorine species, a gas including chlorine species, derivatives of hydrazine, ammonia, carbon monoxide, a gas including amidinates, and/or a gas including metal organic ligands to the processing chamber for a predetermined period to remove oxidation from the barrier layer; and
   c) depositing a metal layer on the barrier layer after b), wherein the metal layer includes a metal selected from a group consisting of cobalt, copper, tungsten, ruthenium, rhodium, molybdenum, and nickel.

2. The method of claim 1, further comprising controlling a temperature of the substrate to a predetermine temperature in a range from 100° C. to 450° C. during b).

3. The method of claim 1, wherein b) further comprises supplying a carrier gas selected from a group consisting of argon and helium.

4. The method of claim 1, wherein the predetermined period is in a range from 2 seconds to 2 minutes.

5. The method of claim 1, further comprising controlling a pressure in the processing chamber to a predetermined pressure in a range from 1 mT to 30 T during b).

6. The method of claim 1, further comprising, after b) and before c), depositing a barrier layer/adhesion layer.

7. The method of claim 6, wherein the barrier layer/adhesion layer includes a material selected from a group consisting of tungsten, tungsten carbonitride, tungsten carbide.

8. The method of claim 1, further comprising exposing the substrate to plasma at least one of before b) and/or after b).

9. The method of claim 8, wherein the plasma is generated using a plasma gas selected from a group consisting of molecular hydrogen, molecular nitrogen and nitrogen trifluoride.

10. The method of claim 8, further comprising controlling a temperature of the substrate to a predetermined temperature in a range from 100° C. to 450° C. while the plasma is generated.

11. The method of claim 8, further comprising controlling a pressure in the processing chamber to a predetermined pressure in a range between 10 mT and 10 T while the plasma is generated.

12. The method of claim 8, further comprising supplying RF power in a range from 500 W to 2.5 kW to generate the plasma.

13. The method of claim 1, wherein c) is performed using at least one of atomic layer deposition, chemical vapor deposition, pulsed nucleation layer, and pulsed deposition layer.

14. The method of claim 1, wherein c) is performed by:
   depositing a metal seed layer using a first deposition method; and
   depositing the metal layer using a second deposition method.

15. The method of claim 14, wherein the second deposition method is selected from a group consisting of electrochemical plating, electroless deposition, or chemical vapor deposition.

16. The method of claim 1, further comprising annealing the substrate.

17. The method of claim 1, wherein the gas including chlorine species is selected from a group consisting of tungsten (V) chloride, tungsten hexachloride, molybdenum tetrachloride, and molybdenum (V) chloride.

18. The method of claim 1, wherein the gas including fluorine species is selected from a group consisting of tungsten hexafluoride and molybdenum hexafluoride.

19. A method for depositing a metal layer on a barrier layer, comprising:

a) arranging a substrate in a processing chamber,
   wherein the substrate has been exposed to at least one of air and/or oxidizing chemistry and includes a metal contact layer and one or more underlying layers defining portions of a transistor, and
   wherein the metal contact layer includes a metal selected from a group consisting of cobalt, tungsten, ruthenium, rhodium, molybdenum, and nickel;
b) supplying a gas selected from a group consisting of hydrazine, a gas including fluorine species, a gas including chlorine species, derivatives of hydrazine, ammonia, carbon monoxide, a gas including amidinates, and/or a gas including metal organic ligands to the processing chamber for a predetermined period to remove oxidation of the metal contact layer; and
c) depositing a barrier layer on the metal contact layer after b), wherein the barrier layer includes a material selected from a group consisting of tantalum nitride, titanium nitride, tantalum, titanium and tungsten carbonitride.

* * * * *